United States Patent
Lillevold et al.

(10) Patent No.: US 10,348,289 B2
(45) Date of Patent: Jul. 9, 2019

(54) PROGRAMMABLE SCR FIRING SYSTEM

(71) Applicants: Hans Lillevold, Yankton, SD (US); Kevin Keller, Coon Rapids, MN (US); Joshua Masters, Patuxent River, MD (US); Charles Singer, St. Inigoes, MD (US); Michael Goodnow, Great Mills, MD (US)

(72) Inventors: Hans Lillevold, Yankton, SD (US); Kevin Keller, Coon Rapids, MN (US); Joshua Masters, Patuxent River, MD (US); Charles Singer, St. Inigoes, MD (US); Michael Goodnow, Great Mills, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 118 days.

(21) Appl. No.: 15/420,405

(22) Filed: Jan. 31, 2017

(65) Prior Publication Data

US 2018/0219544 A1 Aug. 2, 2018

(51) Int. Cl.
| | |
|---|---|
| *H03K 17/13* | (2006.01) |
| *H03K 5/1536* | (2006.01) |
| *F41A 19/58* | (2006.01) |
| *H03K 17/292* | (2006.01) |

(52) U.S. Cl.
CPC ............ *H03K 17/136* (2013.01); *F41A 19/58* (2013.01); *H03K 5/1536* (2013.01); *H03K 17/292* (2013.01)

(58) Field of Classification Search
CPC ...... H03K 17/136; H03K 5/1536; F41A 19/58
USPC .......................................... 327/582
See application file for complete search history.

(56) References Cited

U.S. PATENT DOCUMENTS

| | | | | |
|---|---|---|---|---|
| 5,008,608 A | * | 4/1991 | Unsworth | H02P 27/02 318/729 |
| 5,675,221 A | * | 10/1997 | Yoo | H05B 37/0263 315/291 |
| 6,072,317 A | * | 6/2000 | Mackenzie | G01R 31/3277 324/508 |
| 9,240,728 B2 | * | 1/2016 | Iorio | H02M 3/33576 |

* cited by examiner

*Primary Examiner* — Dinh T Le
(74) *Attorney, Agent, or Firm* — Mark O. Glut; NAWCAD

(57) ABSTRACT

A programmable SCR Firing system that includes modules that work together to manipulate the SCR firing circuitry so that it mimics supply load power signatures. The programmable high speed SCR firing system includes a timing module, a delay module, a zero crossing module, a single phase delay module, a firing pulse delay module, a control interface, and an user interface.

5 Claims, 1 Drawing Sheet

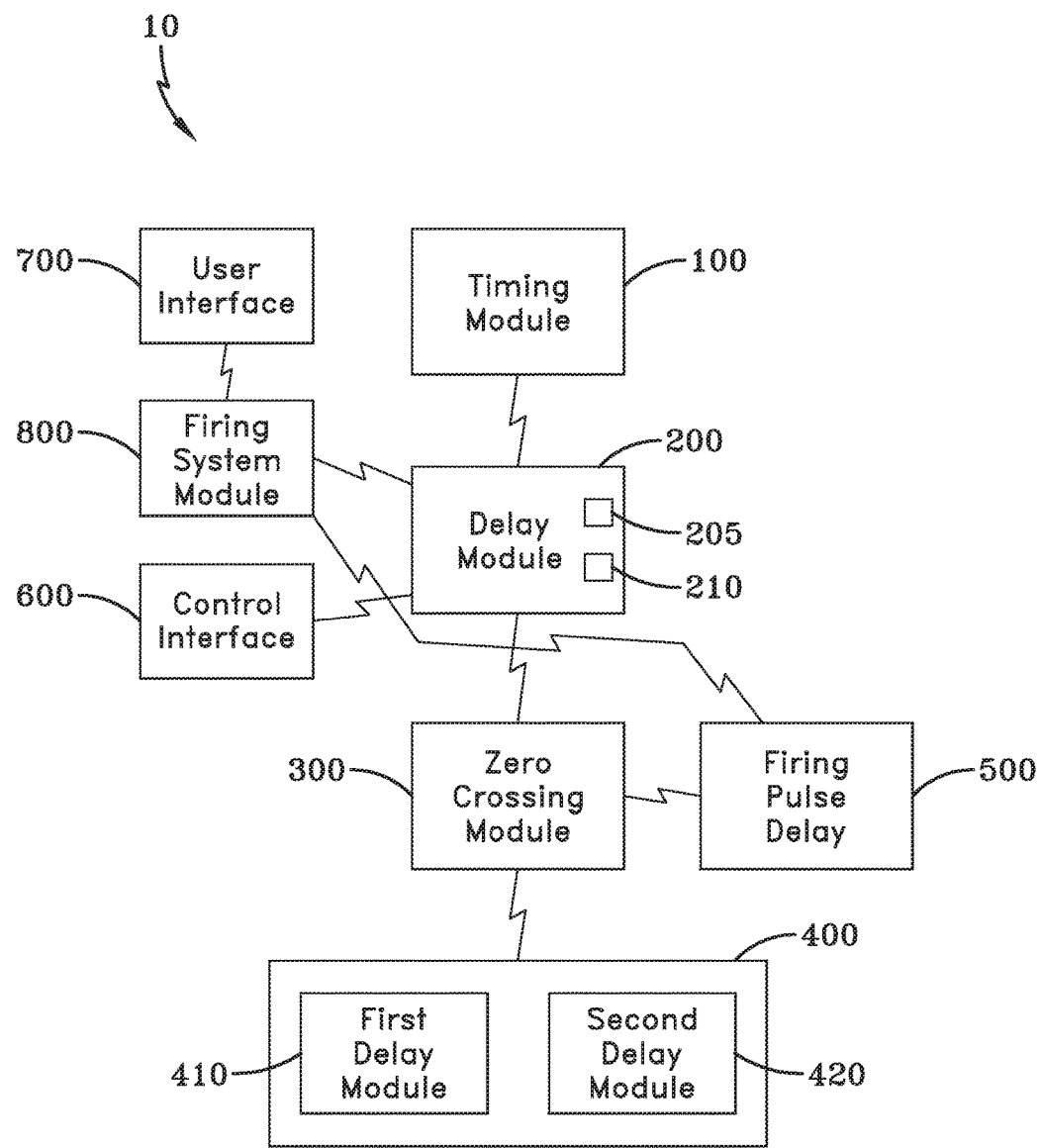

PROGRAMMABLE SCR FIRING SYSTEM

STATEMENT OF GOVERNMENT INTEREST

The invention described herein may be manufactured and used by or for the Government of the United States of America for governmental purposes without payment of any royalties thereon or therefore.

BACKGROUND

Developing large electrical/electromechanical systems and devices, with multiple, components drawing significant power loads, can require many man hours of testing and a significant amount of money to insure that the system or device is operating within the desired specifications. To reduce testing time and expenses, engineers will often emulate the power drawn or consumed by system components under various conditions. Linear, non-pulsing loads have no switching and, therefore, draw current with a linear relationship to the voltage. Consequently, the power drawn from linear elements is relatively easy to emulate.

However, most electronic elements are non-linear loads, which can have current that is leading or lagging the voltage. Consequently, there is an inverse relationship between the current and voltage. That is, current increases as voltage decreases, and vice versa. A non-linear load can create instantaneous rates of change in the current. When this happens, the circuit output is choppy and non-sinusoidal. These switching circuits cause distortion in the power which is very problematic when trying to emulate the power drawn by these loads. This emulation is increasingly more challenging when additional non-linear components are added. When components are added, engineers need to account for fluctuations in power consumption due to device performance characteristics, environmental changes, and the like.

Silicon Controlled Rectifiers (SCRs) based on inductor-resistor (LR), or inductor-resistor-capacitor (LCR) circuits are used to emulate the power drawn from loads in electronics systems. Typically SCRs are four-layer solid state current controlling devices with 3 terminals. Like conventional diodes, SCRs have an anode and cathode terminal. They also have a third control terminal, referred to as a gate. SCRs are unidirectional devices (i.e. they conduct current in only one direction like a diode or rectifier), and are triggered only by currents going into the gate. SCRs combine rectifying features of diodes and the switching ON-OFF control features of transistors.

In their normal OFF state, SCRs restrict current flow to the leakage current. When the gate-to-cathode current exceeds a certain threshold, the device turns ON and conducts current. SCRs remain in the ON state even after the gate current is removed so long as the current through the device exceeds the holding current. Once the current falls below the holding current for a period of time, the device will switch off. If the gate is pulsed and the current through the device is below the latching current, the device will remain in this OFF state. Because of this feature, SCR circuits can be made to control the mean value of an AC load current without dissipating large amounts of power. Therefore, they are used in a variety of applications including AC motor-speed control, temperature control systems, and power regulation circuits, etc.

The drawback of these types of SCR systems is that they are not computer programmable and thus lack emulation accuracy. System engineers need the flexibility to program systems with specific power specifications to accurately mimic the power drawn by particular loads.

Currently, power loads are emulated by utilizing multi-phase resistors that are turned on and off to mimic load signatures. Alternatively, other known systems have utilized a circuit system with multiple loads, wherein one of the loads is always on and drawing a particular voltage and the other resistive load is switched on and off to emulate a load. However, these solutions are problematic because resistive loads will automatically turn on at certain current thresholds, making it impossible to program the system. Consequently, this invention allows engineers to apply an actual known voltage load with a converter and control the timing of the system to more accurately emulate electronic power signatures.

One situation where this emulation accuracy is really needed is in aircraft testing. Typically the most accurate way to test aircraft systems is in-flight, which is time consuming and very expensive. This is particularly true with military aircraft. In addition to the time and expense, there is the additional concern of flight test safety. Therefore, engineers prefer to perform tests on land prior to, or in lieu of, conducting in-flight testing to reduce costs and maximize the safety of the flight crew. Aircraft contain many electronic systems (such as, but without limitation, radar, navigation, and communications equipment) that draw significant power in varying amounts depending on the conditions in which the aircraft is being flown. This makes replicating the power signature of an aircraft particularly difficult.

In addition, military aircraft have highly technical tactical and weapon systems and are designed to execute advanced maneuvers in extreme conditions requiring additional performance from their systems' components. These features and requirements create additional requirements and fluctuations to the power signature of the aircraft's systems.

Consequently, it is critical that engineers are able to accurately emulate the power drawn by aircraft components under these conditions to obtain more accurate testing results to identify system needs and capabilities. Therefore, there is a need for a programmable system that can match component power specifications and more accurately emulate power consumption of the electronic systems.

SUMMARY

The present invention is directed to a programmable SCR firing system, with the needs of the method enumerated above and below.

The present invention is directed toward a programmable high speed silicon controlled rectifier (SCR) firing system that includes a timing module, a delay module, a zero crossing module, a single phase delay module, a firing pulse delay module, a control interface, and an user interface. The timing module is for storing a firing delay signal entered by a user, and for converting the firing delay signal such that the firing delay signal is compatible with delay circuitry. The delay module is for transmitting and instructing the firing system module(s) to fire after the firing delay signal is entered by the user. The delay module is in communication with the timing module. The zero crossing module is for receiving a zero crossing phased signal. The zero crossing phase signal has a positive phase with a rising edge and a negative phase with a falling edge. The zero crossing phase signal is also for outputting signals indicating when the phased signal is positive or negative and when rising edge and falling edge zero crossing have occurred, the zero crossing module is in communication with the delay module. The single phase delay module includes a first delay module wired as delay circuitry for the rising edge and a second delay module wired as delay circuitry for the falling edge. The single phase delay module is in communication with the zero crossing module. The firing pulse delay module is to control firing pulses from the firing system module(s), and the firing pulse delay module is in communication with the zero crossing module and firing system module(s). The control interface is for receiving and routing signals, and the control interface in communication with the delay module. The user interface is for setting the firing delay time, and for enabling and disabling the firing system modules.

This present invention is directed to a silicon controlled rectifier (SCR) firing software method that takes an input voltage from an SCR, detects the point of zero crossing of the voltage, waits a specified, programmed delay, and triggers the SCR. The voltage is generally 115 Volts AC (VAC). However, other voltages can be handled by the system. The system is based on the "positive" and "negative" side of a full wave rectification system. Consequently, so two SCRs can be controlled with one channel of a field programmable gate array (FPGA).

It is a feature of the invention to provide a programmable high speed silicon controlled rectifier (SCR) firing system a way of firing the SCR at an user-defined point following a zero-crossing of the controlling phase voltage; thereby, allowing the user to customize the waveform performance without altering the hardware configuration.

DRAWINGS

These and other features, aspects and advantages of the present invention will become better understood with reference to the following description and appended claims, and accompanying drawings wherein:

FIG. 1 is a block diagram depicting the programmable SCR firing system.

DESCRIPTION

The preferred embodiment of the present invention is illustrated by way of example below and in FIG. 1. As shown in FIG. 1, the programmable high speed silicon controlled rectifier (SCR) firing system 10 includes a timing module 100, a delay module 200, a zero crossing module 300, a single phase delay module 400, a firing pulse delay module 500, a control interface 600, and an user interface 700. The timing module 100 is for storing a firing delay signal entered by a user, and for converting the firing delay signal such that the firing delay signal is compatible with delay circuitry. The delay module 200 is for transmitting and instructing firing system modules 800 to fire after the firing delay signal is entered by the user. The delay module 200 is in communication with the timing module 100. The zero crossing module 300 is for receiving a zero crossing phased signal. The zero crossing phased signal has a positive phase with a rising edge and a negative phase with a falling edge. The zero crossing phase signal is also for outputting indicator signals indicating when the phased signal is positive or negative and when the rising edge and the falling edge have occurred. The zero crossing module 300 is in communication with the delay module 200. The single phase delay module 400 includes a first delay module 410 wired as delay circuitry for the rising edge and a second delay module 420 wired as delay circuitry for the falling edge. The single phase delay module 400 is in communication with the zero crossing module 300. The firing pulse delay module 500 is to control SCR firing pulses, and the firing pulse delay module 500 is in communication with the zero crossing module 300 and the firing system module 800. The control interface 600 is for receiving and routing signals, and the control interface 600 is in communication with the delay module 200. The user interface 700 is for setting the firing delay time, and for enabling and disabling the firing system modules 800.

In the description of the present invention, the invention will be discussed in a military environment; however, this invention can be utilized for any type of application that requires use of a firing system.

In the preferred embodiment, the programmable high speed SCR firing system 10, the timing module 100 allows the delay value to change only when the high speed SCR firing system is active. Additionally, the delay module 200 comprises the delay circuitry for one. The delay module 200 may also include a counter 205 and a comparator 210 that determines when a phased signal sent to the system makes a zero crossing after the specified fire delay and then sends a fire instruction pulse to the SCR. The zero crossing module 300 splits the zero crossing phased signal into separate signals indicating whether the phased signal is positive, whether the phased signals is negative. The zero crossing module 300 may also output a pulse for one clock cycle indicating when the zero crossing phased signal crosses zero and goes positive and a separate pulse when the phase signal crosses zero and goes negative. The single phase delay module 200 may also contain all delay circuitry for one signal phase and setting the output condition is done at 50 MHz. In another embodiment of the invention, the delay module 200 comprises a counter and a comparator that determines when a phased signal sent to the system makes a zero crossing after a specified fire delay and then sends a fire instruction pulse to the firing module.

The silicon controlled rectifier (SCR) firing software method takes an input voltage from an SCR, detects the point of zero crossing of the current, waits a specified, programmed delay, and triggers the SCR. The voltage is generally 115 Volts AC (VAC). However, other voltages can be handled by the system. The system is based on the "positive" and "negative" side of a full wave rectification system. Consequently, two SCRs can be controlled with one channel of a field programmable gate array (FPGA).

The invention is comprised of modules that work together to manipulate the SCR firing circuitry so that it mimics supply load power signatures. The method has a timing module that acts as a basic memory cell for a desired delay. The timing module modifies the delay input in the program by the user. A delay module includes all the delay circuitry for one signal regardless of whether it's a positive delay or negative delay. A zero crossing module takes a zero crossing signal and outputs signals that indicate when the phase is positive or negative and when a rising edge and falling edge zero crossing have occurred. A single phase delay module contains all the delay circuitry for one phase. A firing pulse delay module dictates how long the SCR firing pulse is high, how long it is off between pulses and how many times the firing pulse pulses. In addition, a pulse power load interface connects the delay circuitry with the outside world and acts as an abstraction layer, allowing easy changes in the interface without having to change a significant amount of the code in the software. Finally, this method also uses a pulse power interface script to control a user interface that is used to set the desired delay, view the current delay, and enable or disable channels.

This invention can work with a variety of firing circuit configurations and can utilize AC electrical signals to replicate power signatures. This reduces the need to build separate platforms to replicate each test scenario. This invention can be tuned, through programming, to mimic all non-linear or power supply driven loads.

Consequently, this system can be adapted for use with other applications such as automobiles, power generation plants and buildings to replicate their various electrical systems. This system has the ability to control an arbitrary number of SCRs, and is scalable to any size as long as the Field Programmable Gate Array (FPGA) utilized has the required number of pins. The FPGA can send signals to multiple channels to ensure a current path for the electricity when the SCR is triggered. The additional FPGA channels are customizable and can be independently controlled via programming.

When introducing elements of the present invention or the preferred embodiment(s) thereof, the articles "a," "an," "the," and "said" are intended to mean there are one or more of the elements. The terms "comprising," "including," and "having" are intended to be inclusive and mean that there may be additional elements other than the listed elements.

Although the present invention has been described in considerable detail with reference to certain preferred embodiments thereof, other embodiments are possible. Therefore, the spirit and scope of the appended claims should not be limited to the description of the preferred embodiment(s) contained herein.

What is claimed is:

1. A programmable high speed silicon controlled rectifier (SCR) firing system having a SCR firing pulse, the system comprising:
   a timing module for storing a firing delay time entered by a user, and for converting the firing delay time to a firing delay signal such that the firing delay signal is used with delay circuitry;
   a delay module for delaying the SCR firing pulse until after the firing delay time has elapsed; the delay module signals the timing module once the firing delay time has elapsed;
   a zero crossing module for receiving a zero crossing phased signal, the zero crossing phased signal having a positive phase with a rising edge and a negative phase with a falling edge, and for outputting indicator signals indicating when the phased signal is positive or negative and when the rising edge and the falling edge have occurred, the zero crossing module in communication with the delay module;
   a single phase delay module comprising a first delay module configured as delay circuitry for the rising edge and a second delay module configured as delay circuitry for the falling edge, the single phase delay module receives a zero crossing signal and a signal detailing rising or falling edge from the zero crossing module;
   a firing pulse delay module to control fired pulses from the firing system modules, the firing pulse delay module in communication with the zero crossing module;
   a control interface for receiving and routing the firing delay signal, the zero crossing signal, and the indicator signals, the control interface in communication with the delay module;
   the delay circuitry comprising hardware elements of a Field Programmable Gate Array (FPGA) to monitor a specified length of time and sending a signal to the control interface when the given length of time has elapsed; and,
   a user interface for receiving user entered firing delay times and defining which firing pulse delay modules to enable or disable, the combination of firing delay times and enabled or disabled firing pulse delay modules creates a given profile which can be stored and recalled for later reuse, the user interface sends the profile to the control interface such that firing pulses are sent to the SCR.

2. The programmable high speed SCR firing system of claim 1, wherein the delay module comprises a counter and a comparator that determines when a phased signal sent to the system makes a zero crossing after a specified fire delay and then sends a fire instruction pulse to the firing module.

3. The programmable high speed SCR firing system of claim 1, wherein the zero crossing module splits the zero crossing phased signal into separate signals indicating whether the phased signal is positive, whether the phased signals is negative.

4. The programmable high speed SCR firing system of claim 1, wherein the zero crossing module outputs a pulse for one clock cycle indicating when the zero crossing phased signal crosses zero and goes positive and a separate pulse when the phase signal crosses zero goes negative.

5. The programmable high speed SCR firing system of claim 1, wherein the single phase delay module contains all delay circuitry for one signal phase.

* * * * *